United States Patent [19]
Ohhinata et al.

[11] 4,031,413
[45] June 21, 1977

[54] MEMORY CIRCUIT

[75] Inventors: Ichiro Ohhinata, Yokohama; Shinzi Okuhara, Fujisawa; Tetsuo Takeshita, Yokohama, all of Japan

[73] Assignee: Hitachi, Ltd., Japan

[22] Filed: Jan. 2, 1976

[21] Appl. No.: 646,045

[30] Foreign Application Priority Data

Jan. 10, 1975 Japan .................................. 50-4938
May 14, 1975 Japan ............................ 50-56072

[52] U.S. Cl. ............................. 307/238; 307/284; 307/288; 307/313; 340/173 R
[51] Int. Cl.² ................ G11C 15/04; G11C 11/40
[58] Field of Search .......... 307/238, 284, 288, 313, 307/305; 340/173 R

[56] References Cited
UNITED STATES PATENTS 3,740,730  6/1973  Ho et al. ...................... 307/238 X
3,806,894  4/1974  Nev et al. ...................... 340/173 R
3,918,033  11/1975  Case et al. ...................... 307/238 X

*Primary Examiner*—John Zazworsky
*Attorney, Agent, or Firm*—Craig & Antonelli

[57] ABSTRACT

A memory circuit for providing a zero OFF-holding power under the logical control of three inputs comprises a memory cell including a semiconductor element circuit of equivalently four PNPN layer structure and a logical input section including at least one PNP transistor and NPN transistor with the collector of the PNP transistor connected to the base of the NPN transistor. The NPN transistor in the logical input section has its collector connected to the control gate of the memory cell, and logical input signals are applied to the emitter and base of the PNP transistor and the emitter of the NPN transistor in the logical input section, respectively.

6 Claims, 9 Drawing Figures

FIG.1 PRIOR ART
FIG. 2
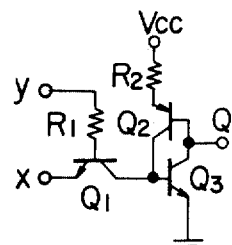
| INPUT | | OUTPUT |
|---|---|---|
| x | y | $Qt_{N+1}$ |
| "1" | "1" | ON |
| "0" | "1" | OFF |
| "1" | "0" | $Qt_N$ |
| "0" | "0" | $Qt_N$ |
FIG. 3
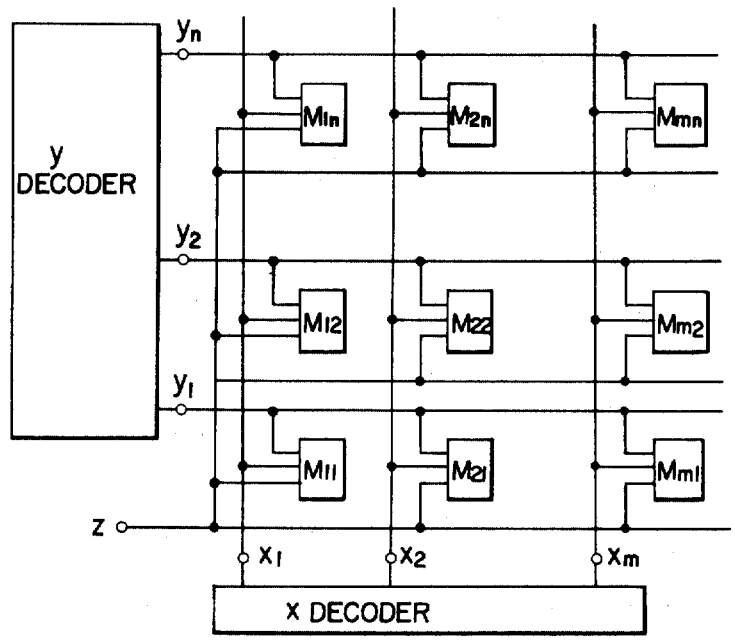

FIG. 4
| INPUT | | | OUTPUT |
|---|---|---|---|
| x | y | z | $Qt_{N+1}$ |
| "1" | "1" | "1" | ON |
| "0" | "1" | "1" | OFF |
| "1" | "0" | "1" | $Qt_N$ |
| "0" | "0" | "1" | $Qt_N$ |
| "1" | "1" | "0" | $Qt_N$ |
| "0" | "1" | "0" | $Qt_N$ |
| "1" | "0" | "0" | $Qt_N$ |
| "0" | "0" | "0" | $Qt_N$ |
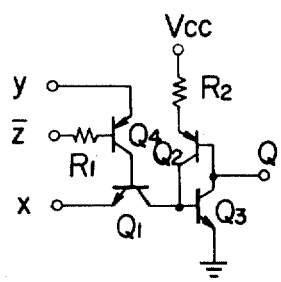
FIG. 5
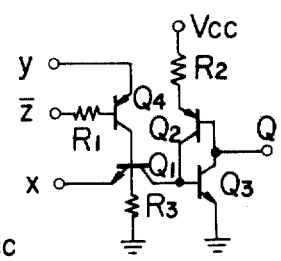
FIG. 6
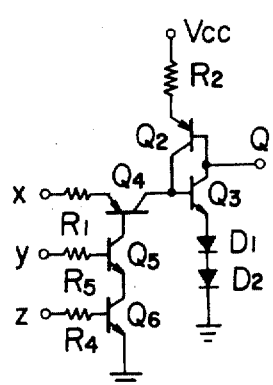
FIG. 7
FIG. 8
FIG. 9

MEMORY CIRCUIT

The present invention relates to a memory circuit, and more particularly to a memory circuit including a semiconductor element circuit of equivalently four PNPN layer structure under the control of three logical inputs $x$, $y$ and $z$ to provide a zero OFF-holding power.

In order that the invention may be readily carried into effect, it will now be described in detail, by way of example, with reference to the accompanying diagrammatic drawings, in which:

FIG. 1 is a circuit diagram of a well-known memory circuit using a semiconductor element circuit of four PNPN layer structure with two inputs;

FIG. 2 is a truth table of the memory circuit with two inputs;

FIG. 3 is a block diagram of a memory circuit arranged in a matrix according to the present invention;

FIG. 4 is a truth table of a memory circuit with three inputs;

FIG. 5 is a circuit diagram of a first embodiment of a memory circuit according to the present invention;

FIG. 6 is a circuit diagram of a second embodiment of a memory circuit according to the present invention;

FIG. 7 is a circuit diagram of a third embodiment of a memory circuit according to the present invention;

FIG. 8 is a circuit diagram of a fourth embodiment of a memory circuit according to the present invention; and FIG 9 is a circuit diagram of a fifth embodiment of a memory circuit according to the present invention.

There are two circuit connections for memories, a symmetrical circuit such as a flip-flop circuit which consumes power in both ON and OFF modes, and an asymmetrical circuit requiring no power comsumption in the OFF mode with the aid of a self-holding effect which a semiconductor element circuit of four PNPN layer structure has. The former circuit is often used because of its excellent characteristics in view of stability of operations, high speed response, etc., but the latter circuit also has the possibility to provide an excellent memory with maximum utilized advantages when used in the field where low power is strictly required and high speed response is of less importance. For example, the memory used in a holding circuit for speech path switches of a telephone exchange system has the most OFF-holding modes and therefore has the requirement of low power and the less important requirement of high speed response. FIG. 1 shows a known memory circuit adapted for use in the holding circuit for the speech path switch. The memory circuit functions according to a truth table shown in FIG. 2 and has the excellent characteristic that a logical input section thereof comprising a transistor $Q_t$ and a resistor $R_1$ as well as memory cell comprising transistors $Q_2$, $Q_3$ and a resistor $R_2$ both have the power consumption of zero in the OFF-holding state. The memory circuit, however, has a drawback that in the case where the memory cells are arranged in a matrix and a decoder for selecting the small $x$, $y$ inputs is connected in the preceding stage, one of the memory cells is inevitably selected and an ON condition is written into it because one/$n$ selection of the memory cells can be performed by two inputs and simultaneously the ON condition written into the selected memory cell. To eliminate this drawback, the third control input $z$ was conventionally added to the memory circuit besides the $x$, $y$ inputs with its functions conformed so as to satisfy a the truth table shown in FIG. 4, as shown, for example, in FIG. 3 where a plurality of memory circuits ($M_{11} \ldots M_{mn}$) are arranged in the form of a matrix. It is to be noted that a switching element such as a transistor is turned on or off in response to an output signal from the memory circuit when it is used in the speech path switch, although in FIG. 3 the output circuit of the memory circuit is shown as eliminated.

A method for providing the $z$ input terminal is to use an AND gate, the use of which, however, leads to the drawback that the power is consumed in the controlling logical input section when the $z$ input is in the 0 holding mode, and the number of AND gates required disadvantageously increases when a memory of large capacity is to be manufactured.

An object of the present invention is to provide a memory circuit including a semiconductor element circuit of equivalently four PNPN layer structure with the OFF-holding power of zero or low power consumption under the control of three logical inputs.

The present invention provides a memory circuit under the logical control of three inputs, comprising a semiconductor element circuit of equivalently four PNPN layer structure, and at least one PNP transistor and NPN transistor. The PNP transistor is connected at its collector to the base of the NPN transistor and the NPN transistor is connected at its collector to the control gate of the semiconductor element circuit so that the emitter and base of the PNP transistor and the emitter of the NPN transistor may function as logical input terminals, respectively.

FIGS. 5 shows the first embodiment of a memory circuit according to the present invention. $Q_1$ and $Q_4$ show an NPN transistor and a PNP transistor which form a logical input section for controlling a memory cell, $R_1$ a resistor for defining the current flowing in the logical input section, $Q_2$, and $Q_3$ a PNP transistor and NPN transistor which form the memory cell of the semiconductor element circuit of equivalently four PNPN layer structure, $R_2$ a resistor for defining the ON-holding current of the memory cell, $V_{cc}$ a terminal of a power supply, $x$, $y$, $z$ logical input terminals, respectively, and Q an output terminal. This circuit functions according to the truth table shown in FIG. 4. It is to be noted that the $z$ input receives inversed 1 and 0, but no problem arises if the $z$ input is inversed prior to its application.

The memory circuit has zero power consumption because the memory cell is formed of the semiconductor element circuit of equivalently four PNPN layer structure. Further, when the logical input section is in the 1 holding condition of the $\bar{z}$ input, the PNP transistor $Q_4$ is cut off and the NPN transistor is cut off in turn, so that the logical input section has the power consumption of zero.

On the other hand, the PNP transistor $Q_4$ and NPN transistor $Q_1$ are off in the 0 $\bar{z}$ input and the 0 holding state of the $y$ input.

In other words, the memory circuit with the zero power consumption in both the memory cell and the logical input section can be obtained in the OFF holding mode of the memory cell comprising the semiconductor element circuit of equivalently four PNPN layer structure.

FIG. 6 shows the second embodiment of the memory circuit according to the present invention, in which a resistor $R_3$ for discharging a storage charge from the base of the transistor $Q_1$ is connected to a connection between the transistors $Q_1$ and $Q_4$ in the memory circuit shown in FIG. 5. Other circuit elements and their operations are the same as those shown in FIG. 5.

In FIG. 7 there is shown the third embodiment of the memory circuit according to the present invention, in which a level shifting diode $D_1$ is connected to the $\overline{z}$ input terminal of the memory circuit shown in FIG. 6 to increase the noise immunity of the circuit. It is to be noted that the level shifting device may be connected to the other input terminals or the emitter of the NPN transistor $Q_3$, the element of the semiconductor element circuit.

FIG. 8 shows the fourth embodiment of the memory circuit according to the present invention, in which $Q_2$, $Q_3$ show a PNP transistor and NPN transistor both constituting the memory cell of the semiconductor element circuit of equivalently four PNPN layer structure, $Q_4$ and $Q_5$, $Q_6$ a PNP transistor and NPN transistors constituting the logical input section for controlling the memory cell, $R_1$, $R_4$, $R_5$ resistors for defining the current to the logical inputs, $R_2$ a resistor for defining the ON-holding current of the memory cell, and $D_1$, $D_2$ level shifting diodes provided to form a level in accordance with the logical input section. $V_{cc}$ shows a terminal of the power supply, $x, y, z$ logical input terminals, respectively, and Q an output terminal. This circuit functions according to the truth table shown in FIG. 4. In this memory circuit, the memory cell consumes no power in the off state because it is considered to be the semiconductor element circuit of equivalently four PNPN layer structure. The logical input section, on the other hand, has its transistors $Q_4, Q_5, Q_6$ cut off in the 0 holding mode of the $z$ input, thus having the zero power consumption. The memory circuit with the zero power consumption can, therefore, be achieved in the $z$ input of 0 and in the OFF-holding mode of the memory cell. In the $z$ input of 1 and in the 0 holding state of the $y$ input, the circuit consumes the power due to the current flowing from the $z$ input to the base of the NPN transistor $Q_5$, but has the very small power consumption at this time because the transistor $Q_5$ is cut off and thus the transistor $Q_6$ has no collector current. It is, therefore, possible to provide the substantially low power consumption also in the OFF-holding mode. Further, the low power consumption can be obtained more efficiently in the use of this memory circuit if a logic is designed by which the more holding modes are realized by the $z$ input of 0.

FIG. 9 shows the fifth embodiment of the memory circuit according to the present invention, in which a level shifting diode $D_3$ is connected to the $z$ input terminal of the memory circuit shown in FIG. 8 to increase the noise immunity of the circuit.

In each embodiment shown in FIGS. 5 to 9 it is understood that the resistors $R_1$, $R_4$ and $R_5$ may be suitably removed when input current from an enabling circuit in a preceding stage is limited. Furthermore, the level shifting diodes $D_1$ and $D_2$ are connected at the side of the semiconductor element circuit in the embodiments shown in FIGS. 8 and 9, but it would be understood that they may be replaced by transistors, etc. Further, a transistor may be connected to provide the output Q, although it is derived from the collector of the NPN transistor $Q_3$ constituting the semiconductor element circuit of equivalently four PNPN layer structure in each of the above-mentioned embodiments.

As mentioned above, the memory circuit according to the present invention, having the logical control input section with the three inputs $x, y, z$, makes it possible to enlarge its functions and has the low power consumption with the zero power consumption in the logical input section in the holding mode generated by the $z$ input and with the zero OFF-holding power in the memory cell. The use of the memory circuit according to the present invention can, therefore, provide a memory with large capacity in accordance with the blocks shown in FIG. 3. In this case, the logical input section including the transistors $Q_4$, $Q_5$ and the memory cell including the transistors $Q_2$, $Q_3$ must be increased depending upon the desired memory capacity, but it is understood that only one transistor $Q_6$ is required to take charge of the $z$ input. In other words, the collector of the transistor $Q_6$ can be combined with the emitter of the transistor $Q_5$ in a multi-connection to provide the memory shown in FIG. 3 with the result of economization of the elements in number.

What we claim is:

1. A memory circuit under the logical control of three inputs, comprising a semiconductor element circuit corresponding to a four layer PNPN structure and having a control gate; at least a PNP transistor and an NPN transistor, the PNP transistor being connected at its collector to the base of the NPN transistor, the NPN transistor being connected at its collector to the control gate of the semiconductor element circuit, whereby the emitter and base of the PNP transistor and the emitter of the NPN transistor function as logical input terminals, respectively.

2. A memory circuit under the logical control of three inputs, comprising a semiconductor element circuit corresponding to a four layer PNPN structure and having a control gate; a PNP transistor; an NPN transistor; and a resistor, the PNP transistor being connected at its collector to the base of the NPN transistor, the NPN transistor being connected at its collector to the control gate of the semiconductor element circuit, and the resistor being connected at its one end to the base of the NPN transistor and grounded at the other end thereof, whereby the emitter and the base of the PNP transistor and the emitter of the NPN transistor function as logical input terminals, respectively.

3. A memory circuit under the logical control of three inputs, comprising a semiconductor element circuit corresponding to a four layer PNPN structure and having a control gate; a PNP transistor; an NPN transistor; and two resistors, the PNP transistor being connected at its collector to the base of the NPN transistor, the NPN transistor being connected at its collector to the control gate of the semiconductor element circuit, a first one of said two resistors being connected at its one end to the base of the PNP transistor, and the second resistor being connected at one end to the base of the NPN transistor and grounded at the other end thereof, whereby the emitter of the PNP transistor, the other end of the first resistor and the emitter of the NPN transistor function as logical input terminals, respectively.

4. A memory circuit under the logical control of three inputs, comprising a semiconductor element circuit corresponding to a four layer PNPN structure and having a control gate; a PNP transistor; an NPN transistor; two resistors; and a diode, the PNP transistor being connected at its collector to the base of the NPN transistor and also being connected at its base to a first one of said two resistors through the diode, the NPN transistor being connected at its collector to the control gate of the semiconductor element circuit with the second resistor being connected between the base of the NPN transistor and ground, whereby the emitter of the PNP transistor, the other end of the first resistor and the emitter of the NPN transistor function as logical input terminals, respectively.

5. A memory circuit under the logical control of three inputs, comprising a semiconductor element circuit corresponding to a four layer PNPN structure and having a control gate; a PNP transistor; and two NPN transistors, the PNP transistor being connected at its base to the collector of a first one of the NPN transistors and also being connected at its collector to the control gate of the semiconductor element circuit, the first NPN transistor being connected at its emitter to the collector of the second NPN transistor which is grounded at its emitter, whereby the emitter of the PNP transistor, and the bases of the first and second NPN transistors function as logical input terminals, respectively.

6. A memory circuit under the logical control of three inputs, comprising a semiconductor element circuit corresponding to a four layer PNPN structure and having a control gate; a PNP transistor; two NPN transistors; three resistors; and a diode, the PNP transistor being connected at its base to the collector of a first one of said two NPN transistors, at its collector to the control gate of the semiconductor element circuit and at its emitter to one end of a first one of said three resistors, the first NPN transistor being connected at its emitter to the collector of the second one of said two NPN transistors and at its base to one end of a second one of the said three resistors, the base and emitter of the second NPN transistor being connected to one end of a third one of said three resistors through the diode and direct to ground, respectively, whereby the other end of each of said first, second and third resistors function as logical input terminals, respectively.

* * * * *